United States Patent [19]

Liang et al.

[11] Patent Number: 5,296,744
[45] Date of Patent: Mar. 22, 1994

[54] LEAD FRAME ASSEMBLY AND METHOD FOR WIRING SAME

[75] Inventors: Louis H. Liang, Los Altos; Sang S. Lee, Sunnyvale, both of Calif.

[73] Assignee: VLSI Technology, Inc., San Jose, Calif.

[21] Appl. No.: 893,553

[22] Filed: Jun. 3, 1992

Related U.S. Application Data

[63] Continuation of Ser. No. 728,927, Jul. 12, 1991, abandoned.

[51] Int. Cl.$^5$ .................. H01L 23/48; H01L 29/44; H01L 29/52
[52] U.S. Cl. .................. 257/784; 257/786
[58] Field of Search .................. 357/70, 71, 72; 257/784, 786

[56] References Cited

U.S. PATENT DOCUMENTS 5,091,772 2/1992 Kohara et al. .................. 257/784

FOREIGN PATENT DOCUMENTS

| | | | |
|---|---|---|---|
| 60-92646 | 5/1985 | Japan | 357/70 |
| 59-107551 | 6/1985 | Japan | 357/70 |
| 60-176245 | 9/1985 | Japan | 357/70 |
| 02-122662 | 5/1990 | Japan | 357/70 |

*Primary Examiner*—Jerome Jackson
*Assistant Examiner*—D. Monin
*Attorney, Agent, or Firm*—Hickman & Beyer

[57] ABSTRACT

A lead frame assembly characterized by alternating high and low wire loops which connect the attach pads of an integrated circuit die to the conductive fingers of the lead frame. The alternating loops reduce the likelihood that adjacent loops will short out due to twists in the wires or due to connecting wire "sweep" caused by subsequent plastic encapsulation. A number of high loops can be attached before the formation of the first low loop or vice versa. Alternately, the high and low wire loops can be attached in an alternating fashion.

4 Claims, 3 Drawing Sheets

LEAD FRAME ASSEMBLY AND METHOD FOR WIRING SAME

This is a continuation of copending application Ser. No. 07/728,927 filed on Jul. 12, 1991, now abandoned.

BACKGROUND OF THE INVENTION

This invention relates generally to integrated circuit packaging and more particularly to lead-frame type integrated circuit packaging.

Integrated circuit chips (or "dies") can be packaged in a variety of ways. For example, pre-manufactured I.C. packages are made from plastic, ceramic, or other suitable materials which include a body, a number of conductive leads emanating from the body, and a die cavity. An I.C. die is attached within the die cavity and is wired to the leads of the package with a multiplicity of connecting wires. A lid is then placed over the die cavity to hermetically seal the I.C. die within the pre-manufactured package.

Another common packaging method utilizes a lead frame including an I.C. die support and a number of conductive fingers extending generally radially away from the support. An I.C. die is attached to the support and is wired to the fingers with a number of connecting wires. The lead frame and wired I.C. die are then placed within the cavity of a transfer molding apparatus and a plastic material is injected into the cavity to encapsulate the I.C. die and much of the lead frame. The ends of the lead frame fingers are then cut and bent to form the leads of the packaged integrated circuit.

The number of input/output (I/O) attach pads on an integrated circuit die tends to increase with increasing complexity of the integrated circuitry. For example, large scale integration (LSI) will have on the order of 64 attach pads on an I.C. die, while the current generation of very large scale integration (VLSI) will have on the order of 160 attach pads on an I.C. die. The next generation of ultra large scale integration (ULSI) may have 300 or more attach pads on a single integrated circuit die.

The large number of attach pads on a modern I.C. die can result in difficulties with the connecting wires of lead-frame type packages. The wires, which are often 1-2 thousandths of an inch (Mils) in diameter are very flimsy and can easily short out with adjacent wires if they are even slightly displaced due to vibration, impact, etc. This problem is compounded by the fact that the bulk material for the connecting wires is purchased as a tightly wound spool of wire, which results in the connecting wires exhibiting an inherent twist. If two adjacent connecting wires twist in opposite directions the chance of a short is greatly increased. Furthermore, with lead frame type packages the injection of the plastic compound to encapsulate the I.C. die can cause the wires to flex in the direction of fluid flow (a phenomenon known as "sweep"), thereby increasing the likelihood of shorting out adjacent wires. Therefore, lead frame type packages are much more vulnerable to shorting of the connecting wires than pre-manufactured plastic or ceramic packages.

One possible solution to this problem is to insulate the connecting wires so that if they do touch they don't short out. Another solution is to shorten the connecting wires by use of an interposer. However, these solutions are difficult to implement and tend to be quite expensive, and therefore are not used much within the integrated circuit industry.

There is also a reverse correlation between integrated circuit complexity and I.C. die size. Modern I.C. die tend to be smaller and more complex and therefore require longer connecting wires. These longer wires greatly increase the shorting problem between adjacent wires. One solution to the long connecting wire problem is to reduce the size of the pre-manufactured packages or lead-frame type packages. However, this solution is not desirable for several reasons. For pre-manufactured packages, it is more cost-effective and practical to standardize on a few package sizes which accommodate both large and small die sizes. For lead-frame type packages, it gets very expensive to decrease the size of the I.C. support and to bring the fingers in closer to the support. This is because as the fingers get smaller and closer together it is no longer possible to inexpensively stamp out the lead frames from a metal foil and, instead, requires that the lead frames be made by a much more expensive metal-foil etching process. Furthermore, even with metal-foil etching processes there are severe technical limitations on how closely the lead fingers can be spaced for a given foil thickness.

Another problem with smaller die sizes having large numbers of attach pads is how to position the tip of a wire bonding tool on a bonding pad without contacting and possibly damaging adjacent bonding pads and/or wires. One solution to this problem is to stagger the attach pads in a zig-zag fashion to provide larger spaces between adjacent pads while simultaneously increasing the effective pitch of the attach pads. Another solution used in pre-manufactured ceramic packages is to have several shelves within the die cavity having contacts leading to the leads of the package. Of necessity, the connecting wires in this type of pre-manufactured package are of varying lengths and possibly loop heights depending upon which shelf to which they are attached. This multishelf ceramic package solution was devised to address the aforementioned bonding tool tip access problem and not the connecting wire shorting problem.

Modern VLSI circuitry is predominantly packaged with lead frame packaging for cost considerations. As such, virtually all of the factors leading to shorts between connecting wires are present. It is economically undesirable to create lead frames with fingers which extend close to the small I.C. dies for the reason mentioned above. This necessitates rather long connecting wires which, due to their inherent twist and due to injection molding sweep, have a good chance of contacting adjacent wires. Insulating the connecting wires tends to be economically impractical. The connecting wires could be made thicker, but this would necessitate bigger attach pads on the I.C. dies and a larger pitch between the attach pads, both of which are undesirable because they increase the size of the I.C. dies. In consequence, the prior art has not adequately addressed the problem of how to economically package a small integrated circuit die having long connecting wires in a lead frame type package without shorting out adjacent connecting wires in an unacceptably large number of I.C. assemblies.

SUMMARY OF THE INVENTION

The present invention provides a practical and effective solution for the problem of electrical shorts between long connecting wires in lead frame assemblies.

A lead frame assembly in accordance with the present invention includes a lead frame, an integrated circuit die, and a plurality of wire loops coupling attach pads of the die to fingers of the lead frame, where adjacent loops are substantially different in height. Preferably, the wire loops alternate between high and low loops. The lead frame assembly can be made into a packaged integrated circuit assembly by injecting an insulating, thermal-set material around the assembly which encapsulates the die and a majority of the lead frame. The free ends of the lead frame fingers can be bent into the leads of the final integrated circuit assembly.

The structure of the present invention can be advantageously implemented by several methods. For example, some or all of the low loops of connecting wires can be attached before the attachment of a high loop of connecting wire, or vice versa. Another method involves the alternate attachment of high and low loops of connecting wire.

Since adjacent connecting wires are of different heights, the chance the they will contact and short out with each other is greatly reduced. This permits the use of longer, thinner wires for the lead frame I.C. assembly, which is very advantageous for small, high density I.C. dies having large numbers of attach pads. The use of long wires also allows the use of stamped lead frames rather than the more finely pitched (but much more expensive) etched lead frames.

These and other advantages of the present invention will become clear to those skilled in the art upon a study of the detailed description of the invention and of the several figures of the drawings.

DETAILED DESCRIPTION OF THE PREFERRED EMBODIMENTS

Figure 1:
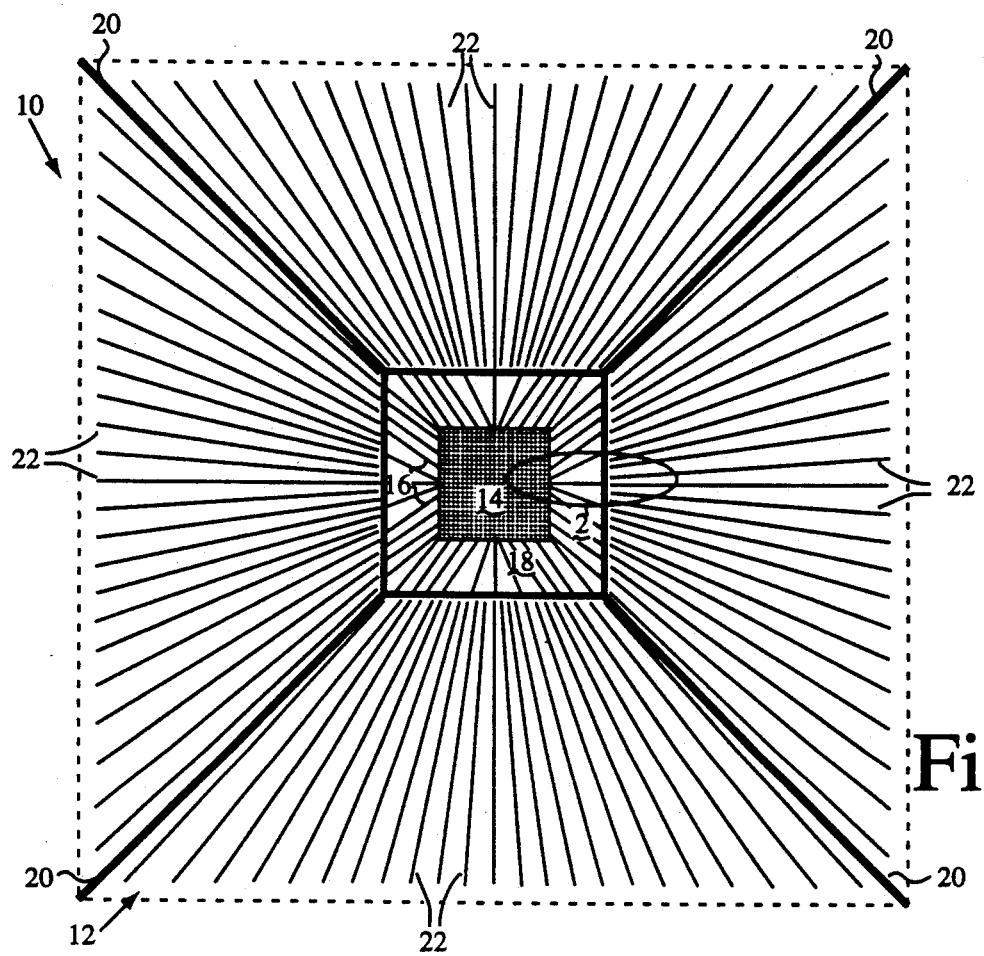
FIG. 1 is a partial, top plan view of a lead frame assembly in accordance with the present invention.

In FIG. 1, a lead frame assembly 10 in accordance with the present invention includes a lead frame 12, an integrated circuit (I.C.) die 14, and a plurality of connecting wires 16 connected beween the lead frame 12 and the I.C. die 14. As will be discussed subsequently in greater detail, the die 14, the connecting wires 16 and much of the lead frame 12 are eventually encapsulated in a thermoplastic material to form a completed integrated circuit assembly.

Leads frames, such as lead frame 12, are commercially available from a variety of sources, and are typically made from a thin Alloy 42 or copper foil by a stamping or etching process. The lead frame 12 includes a generally square support 18 held by four radial arms 20. A number of conductive fingers 22 extend generally radially away from the support 18. These fingers, which do not quite touch the support 18, have distal ends which are ultimately formed into the leads of the integrated circuit assembly.

Figure 2:
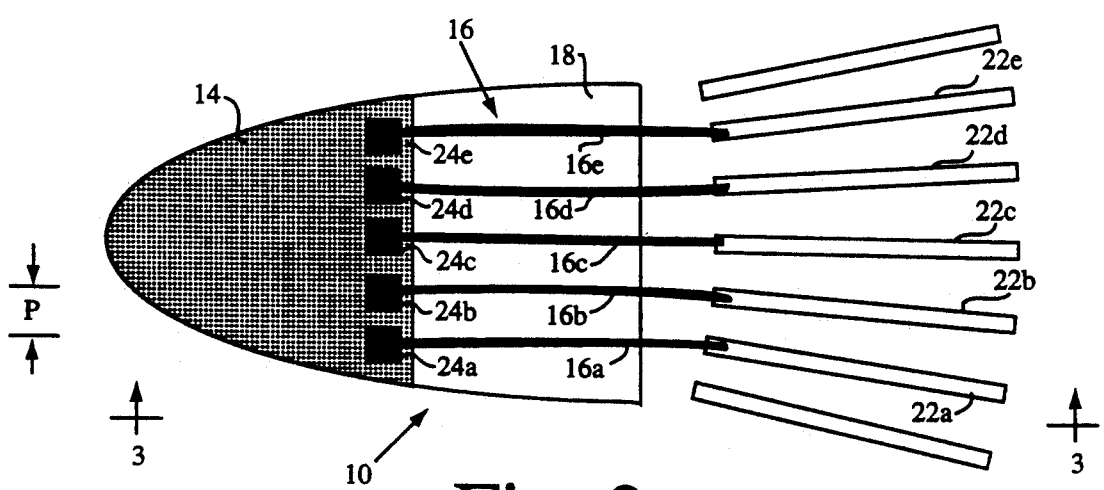
FIG. 2 is an enlarged view of the portion of FIG. 1 which is encircled by a line 2.

Referring now to the enlarged view of FIG. 2, the I.C. die includes a number of attach pads 24. Connecting wires 16, which are typically made from aluminum or gold, are coupled between the attach pads 24 and the tips of fingers 22. The connecting wires 16 can be attached to the attach pads 24 and fingers 22 by ball bonding, wedge bonding or other techniques well known to those skilled in the art. A suitable commercially available machine for performing the bonding process is the K&S Model 1484 Wire Bonder made by Kulic Soffa of Horsham, Pennsylvania. Other suitable wire bonders are made by Shinkawa, Kaijo Denki, and Toshiba, all of Japan.

Figure 3:
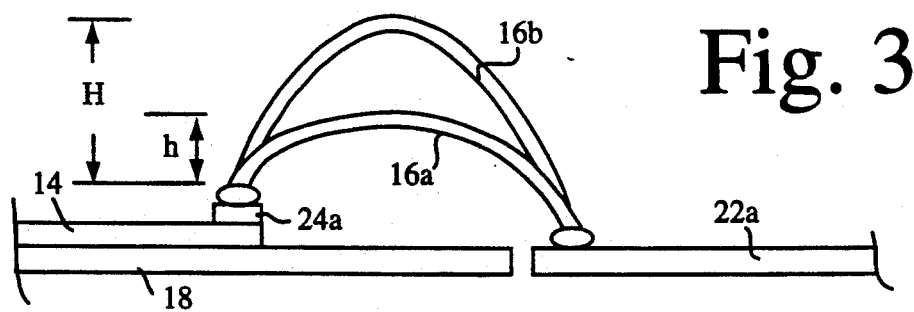
FIG. 3 is an elevational view taken along line 3—3 of FIG. 2.

In FIG. 2 and FIG. 3, a first connecting wire 16a is attached between an attach pad 24a of I.C. die 14 and the tip of a finger 22a. As seen in FIG. 2, a second connecting wire 16b is coupled between an attach pad 24b and a finger 22b, a third connecting wire 16c is coupled between an attach pad 24c and a finger 22c, etc.

As seen in FIG. 3, wire 16a is formed into a lower loop than wire 16b. As used herein "loop" means any curve or pattern made by a connecting wire, as opposed to the linear connection of a connecting wire between an attach pad 24 and a finger 22. Connecting wire 16a is therefore referred to as a "low loop" having a height h while connecting wire 16b is referred to as a "high loop" having a height H. Of course, the loops of wires 16 are generally not perfectly vertical or even planar, as is suggested in the top plan view of FIG. 2. Connecting wires 16c, 16d, 16e, etc. follow the same low/high pattern as connecting wires 16a and 16b. In consequence, adjacent connecting wires have substantially different loop heights.

This high/low alternation of connecting wire loops substantially reduces the likelihood of shorts between adjacent connecting wires. The low loops exhibit relatively little flexure, even during the injection molding of the encapsulating plastic around the lead frame assembly 10. The high loops flex more than the low loops, but they tend to flex over the low loops without touching them. Table 1 illustrates the reduced incidence of shorts when employing the high/low loops of the present invention.

TABLE 1

|  | Uniform Loops | Alternating Loops |
| --- | --- | --- |
| Wire Material | Gold | Gold |
| Loop Height | 8 Mil | 8 Mil/12 Mil |
| Number of Wires | 120 | 120 |
| Wire Length | 250 Mil | 250 Mil |
| Wire Diameter | 1.3 Mil | 1.3 Mil |
| No. of Shorts | 4 | 0 |
| % Shorted Wires | 3.3% | 0% |

In the test summarized by Table 1 it is clear that alternating 8 Mil and 12 Mil loops dramatically decreases the number of shorted wires for the lead frame assembly. In this test the difference in heights between the low loops and the high loops is about 50% of the low loop height. However, smaller differences, such as a difference of 10% of the low loop height can also be beneficial.

While the preferred embodiment of the present invention uses alternating high and low loops, there are other loop patterns which also greatly reduce the problem of two adjacent connecting wires shorting out. For example, the connecting wires can be of three different lengths such that there are high (H), medium (M), and low (L) loops formed of the connecting wires. The loops could then alternate between high, medium and low in a pattern as follows: L-M-H-M-L-M-H-M, etc. Of course, the first and last connecting wires will not fit into this pattern unless the total number of wires was evenly divisible by four, just as the first and last connecting wires of the preferred embodiment of high and low loops would be of the same loop height unless the total number of wires are evenly divisible by two.

Figure 4A:
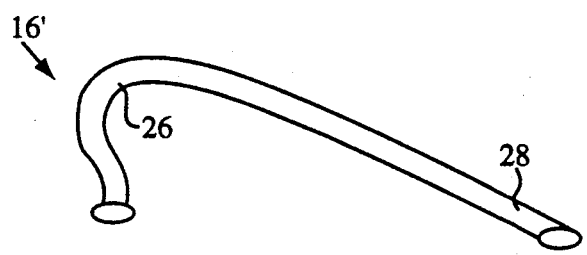
FIGS. 4a and 4b illustrate two alternative embodiment for the connecting wire loops of the present invention.
Figure 4B:
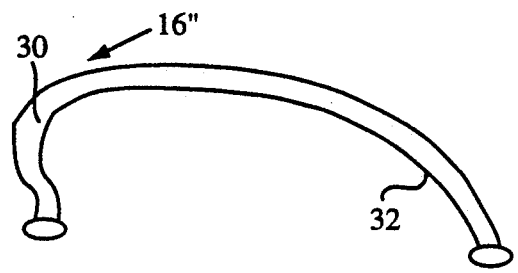

FIGS. 4a and 4b illustrate two alterntive loop configurations for the connecting wires. In FIG. 4a, a loop of a connecting wire 16' includes a kinked or hooked portion and a substantially straight leg portion 28. This configuration may be preferable to the configuration shown in FIG. 3 because the long leg portion 28 pulls on the hooked portion 26 to provide accurate height control. In FIG. 4b, a loop of connecting wire 16" also includes a hooked portion 30 but has a leg portion 32 which is curved. This configuration has the advantage of being more loop shaped that the previously described configurations and therefore is less mechanically stressed.

The present invention includes several processes for producing the lead frame assembly 10. In the preferred embodiment having alternating high and low loops, all of the low loops of connecting wire can be formed first before the formation of the high loops, or vice versa. This, of course, would require that the die 14 be wired in at least two successive passes. Alternatively, the low and high loops of connecting wire can be attached alternately to wire the I.C. die 14 in a single pass, although this requires more sophisticated wire bonding equipment. A third option is to attach a number of connecting wires of the same loop height before switching to the attachment of connecting wires of a different loop height. An example of this third option would be to attach all of the low loops along one side of an I.C. die 14 and then attach all of the high loops along that side. It may be less stressful on the bonding machine to sequentially attach a number of loops having the same loop height before switching to another loop height.

A exemplary set-up of a wire bonding machine to perform the process of the present invention will be discussed with reference to the aforementioned K&S Model 1484 Wire Bonder. First, the operator programs the index adjustment for the frame size and pitch of the attach pads. Next, the operator calibrates the Ultra Sonic Generator (U.S.G.) for the proper force level. Third, the machine is set-up for the proper pattern recognition and, fourth, the capillary which feeds the bulk connecting wire is installed. Next, the bonding parameters are set such as power, time, force, loop configuration, loop height, ball size, etc. Finally, the connection wires are attached by one or more of the sequences described above.

Figure 5:
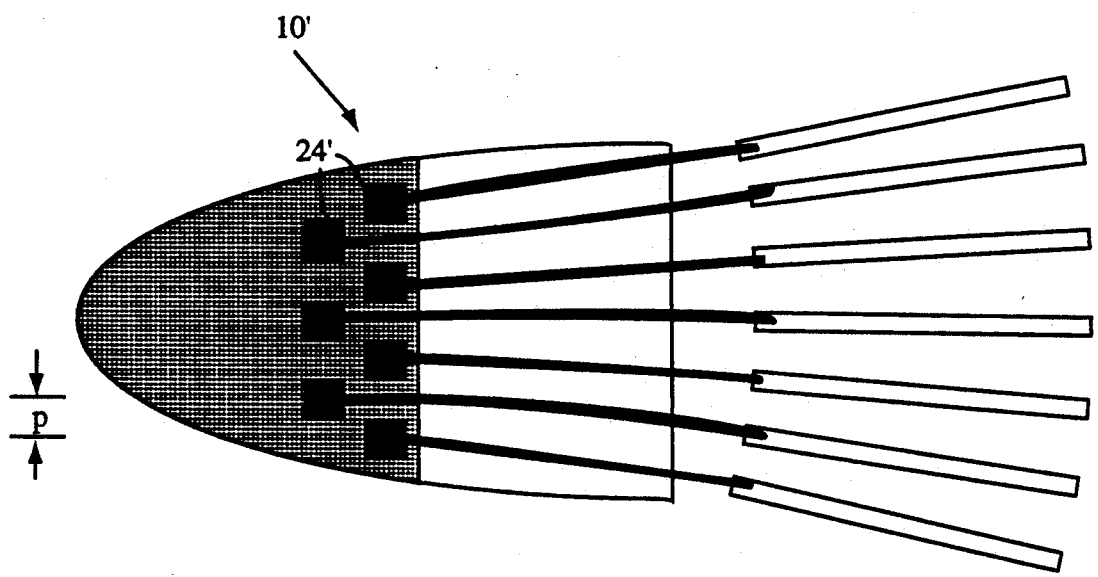
FIG. 5 illustrates an alternate embodiment of the present invention where the attach pads of the I.C. die are staggered.

FIG. 5 illustrates an alternate lead assembly 10' which uses staggered attach pads 24' to provide a finer pitch p than the pitch P of lead frame 10 without the danger of damage to adjoining attach pads by the tip of a bonding tool. The finer pitch p permits even more I/O connections for a particular die size than the broader pitch P.

Figure 6:
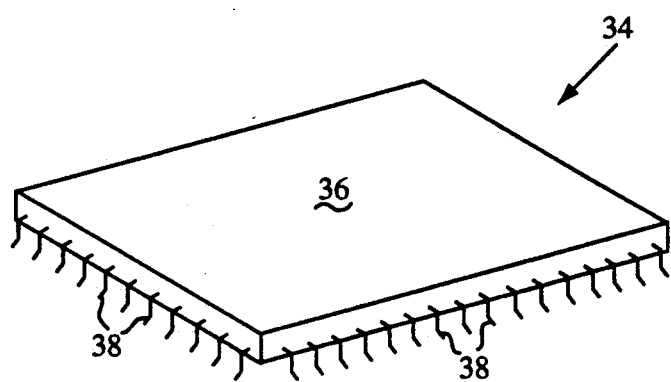
FIG. 6 is a perspective view of a packaged integrated circuit assembly in accordance with the present invention.

FIG. 6 is a perspective view of a complete integrated circuit assembly 34 in accordance with the present invention. The lead frame assembly 10 is imbedded within a thermoplastic material 36 such that the only the distal portions of the lead frame fingers are exposed. These distal portions of the lead frame fingers are then bent to form leads 38 to permit electrical connection to the circuitry of the I.C. die 14. The various injection molding processes for embedding a lead frame assembly in a thermoplastic material are well known to those skilled in the art.

While this invention has been described in terms of several preferred embodiments, it is contemplated that various alterations and permutations thereof will become apparent to those skilled in the art. It is therefore intended that the appended claims include all such alterations and permutations as fall within the true spirit and scope of the present invention.

What is claimed is:

1. A lead frame assembly comprising:
a lead frame including support means and a plurality of fingers, each finger having first and second ends and extending generally radially away from said support means;
an integrated circuit die coupled to said support means and including a plurality of attach pads; and
a plurality of connecting wires, each wire having two ends and being connected between one of the attach pads and one of the fingers at a first end of the finger so that a central portion of each wire is higher than the end of the wire connected to said attach pad and the end of the wire connected to said finger, where for each two wires that are adjacent to each other, a central portion of a first wire lies entirely above a central portion of a second wire and a portion of said first wire between said attach pad and said central portion lies substantially above a portion of said second wire between said attach pad and said central portion so that central portions and portions of the plurality of connecting wires between said attach pad and said central portion form an alternating sequence of high-lying wires of greater height, medium-lying wires of middle height, and low-lying wires of lesser height with no overlap in height of the central portions or portions between said attach pad and said central portion of any two adjacent wires.

2. A lead frame assembly as recited in claim 1 wherein said connecting wires form an repeating sequential pattern of high-lying wires of greater height, medium-lying wires of middle height, low-lying wires of lesser height, and medium-lying wires of middle height.

3. A method for wiring a lead frame assembly comprising connecting a plurality of die attach pads of an integrated circuit die to a plurality of fingers of a lead frame with a plurality of wire loops such that central portions of adjacent wire loops and portions of adjacent wire loops between said attach pads and said central portions are of substantially different heights and such that said plurality of wire loops do not cross over an adjacent finger or an adjacent die attach pad, wherein said adjacent loops alternate between a high loop of greater height, a medium loop of middle height, and a low loop of lesser height.

4. A method as recited in claim 3 wherein said adjacent loops alternate in the repeating sequential pattern of low loop, medium loop, high loop, and medium loop.

* * * * *